United States Patent
Jenq

(12) 
(10) Patent No.: US 6,211,079 B1
(45) Date of Patent: Apr. 3, 2001

(54) METHOD FOR FABRICATING INTERCONNECTS OF A DYNAMIC RANDOM ACCESS MEMORY (DRAM)

(75) Inventor: J. S. Jason Jenq, Pingtung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/164,922

(22) Filed: Oct. 1, 1998

(30) Foreign Application Priority Data

Jul. 18, 1998 (TW) .................................. 87111749

(51) Int. Cl.[7] ........................ H01L 21/44; H01L 21/4763
(52) U.S. Cl. ........................ 438/672; 438/656; 438/685; 438/648
(58) Field of Search ........................ 438/672, 656, 438/685, 648, 657, 666, 675, 684, 239

(56) References Cited

U.S. PATENT DOCUMENTS 5,275,963 * 1/1994 Cederbaum et al. .................. 437/48

OTHER PUBLICATIONS

Wolf, S.;'Silicon Processing for the VLSI Era'; vol. 2; Lattice Press; Sunset Beach Ca.;1990; pp. 194–196.*

* cited by examiner

*Primary Examiner*—Long Pham
*Assistant Examiner*—Neal Berezny
(74) *Attorney, Agent, or Firm*—Jiawei Huang; J.C. Patents

(57) ABSTRACT

A method for fabricating interconnects of a DRAM, in which the contact windows are formed segment by segment and the contact windows are filled segment by segment to form interconnects. Also, tungsten plugs are used to replace the polysilicon plugs and the polysilicon bit lines, so as to reduce the resistance and increase the operating speed.

15 Claims, 4 Drawing Sheets

METHOD FOR FABRICATING INTERCONNECTS OF A DYNAMIC RANDOM ACCESS MEMORY (DRAM)

CROSS-REFERENCE TO RELATED APPLICATION

This application claims the priority benefit of Taiwan application serial no. 87111749, filed Jul. 18, 1998, the full disclosure of which is incorporated herein by reference.

BACKGROUND OF THE INVENTION

1. Field of Invention

The present invention generally relates to a method for fabricating a dynamic random access memory (DRAM), and more particularly to a method for fabricating interconnects of a DRAM.

2. Description of Related Art

Dynamic random access memory (DRAM) is a widely used integrated circuit device, which plays an indispensable role in the electronic industry. FIGS. 1A and 1B are diagrammatic cross-sectional views showing successive stages of a conventional method for fabricating interconnects of a DRAM cell. With reference first to FIG. 1A, a semiconductor substrate 10 is provided, in which a plurality of insulating structures 20, for example, shallow trench isolation structures, are formed to isolate active areas. A plurality of transistor gates are subsequently formed on the substrate, which consist of a first doped polysilicon layer 30 and a tungsten silicide layer 40. A silicon nitride layer 50 and a spacer 60 surrounding the gate are successively formed for every transistor. Also, a bit line consisting of a second doped polysilicon layer 210 and a tungsten silicide layer 220 are formed to contact a source/drain region. A first insulating layer 230 is deposited and patterned to form an opening 240 to expose the source/drain region on the substrate.

With reference to FIG. 1B, a third doped polysilicon layer 250 is formed on the substrate, covering and filling the opening 240. The third doped polysilicon layer is then patterned to form a lower electrode 250 of a capacitor. After that, a hemispherical grain (HSG) layer 260 is formed on the surface of the lower electrode 250 to increase the surface coverage for the capacitor, and consequently the charging capacity. A capacitive dielectric layer (not shown), for example, a multi-layer structure of oxide/nitride/oxide (ONO), is formed on the surface of the HSG layer 260. The capacitive dielectric layer is formed by growing a thin oxide layer on the rough surface of the third doped polysilicon layer. Subsequently, a thin silicon nitride layer is deposited on the silicon oxide layer by using a chemical vapor deposition (CVD) method. Finally, a thermal oxidation process is performed to oxidize the surface of the silicon nitride layer to form the ONO structure. Subsequently, a fourth doped polysilicon layer is deposited and patterned to form an upper electrode 270 of the capacitor. Finally, a second insulating layer 280 is deposited on the substrate.

FIG. 2 is a diagrammatic cross-sectional view of a peripheral circuit of a DRAM showing a conventional method for fabricating interconnects. Note that the fabrication of a DRAM cell and the peripheral circuit of the DRAM are simultaneously performed. That is, a semiconductor substrate 10 is first provided, on which a plurality of transistor gates are formed, which consist of a first doped polysilicon layer 30 and a tungsten silicide layer 40. A silicon nitride layer 50 on the transistor gate and a spacer 60 surrounding the transistor gate are subsequently formed. A first insulating layer 230 and a second insulating layer 280 are successively deposited and patterned to form a plurality of contact windows. Finally, the contact windows are filled with tungsten to form interconnects 300. Unfortunately, problems arise when filling the contact windows with a metal barrier material or tungsten because of a higher aspect ratio of the contact windows.

Conventional methods for fabricating interconnects of a DRAM generally form contact windows required by the peripheral circuits at the last stage. Since the contact windows for forming interconnects generally have a small cross section and great depth, the fabricating complexities therefore increase as the aspect ratio of the contact windows increases, which implies an inferior production efficiency. Particularly, node contact windows are generally fabricated with a small opening according to the design rules, which typically require a taper etching to perform this task. The taper etching, however, creates a problem of having a higher resistance for the node contact window. A higher step height of the contact window also creates problems for filling a metal barrier material, for example, titanium/titanium nitride (Ti/Tin), into the contact windows. In addition, the higher aspect ratio of a deep trench also makes it very difficult to fill tungsten into the contact window, resulting in a higher resistance value for the contact windows.

In addition, bit line interconnects are conventionally fabricated using polysilicon. Since the resistance of the bit line interconnects using polysilicon is higher than that using tungsten, a higher power dissipation and a slow operating speed will occur.

SUMMARY OF THE INVENTION

It is therefore an objective of the present invention to provide a method for fabricating interconnects for a DRAM, so that the conventional problems of forming all of the required contact windows through a single etching process and filling the contact windows to form interconnects at one time can be solved.

It is another objective of the present invention to provide a method for fabricating interconnects for a DRAM, so as to prevent the problems of a higher contact resistance and a slower signal transmission rate due to a higher time constant.

In accordance with the foregoing and other objectives of the present invention, a method for fabricating interconnects of a DRAM is provided, in which the contact windows are formed and filled segment by segment to form interconnects, so that the conventional problems mentioned earlier can be avoided. Also, tungsten plugs are used to replace the polysilicon plugs and the polysilicon bit lines, so as to reduce the resistance and increase the operating speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
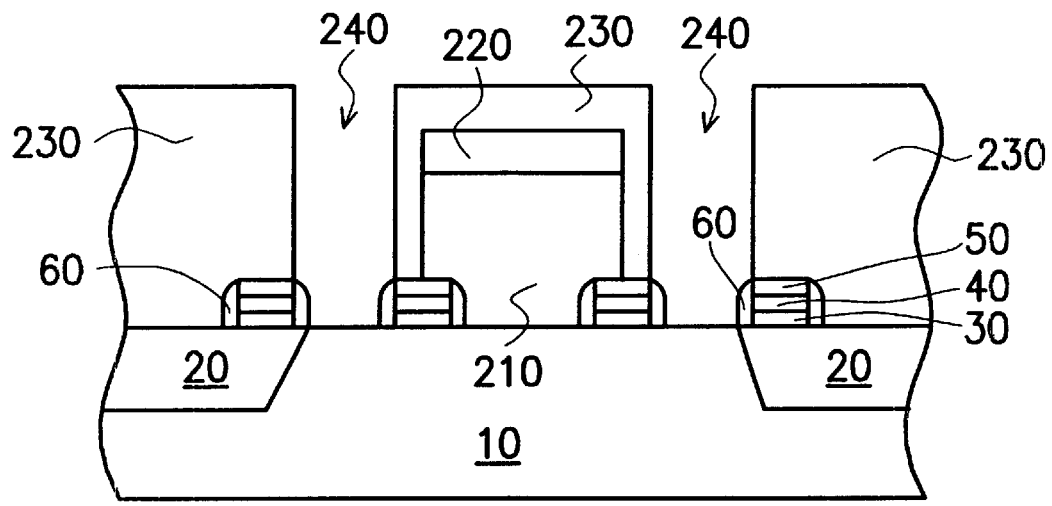
FIGS. 1A and 1B are diagrammatic cross-sectional views showing successive stages of a conventional method for fabricating interconnects of a DRAM cell.
Figure 1B:
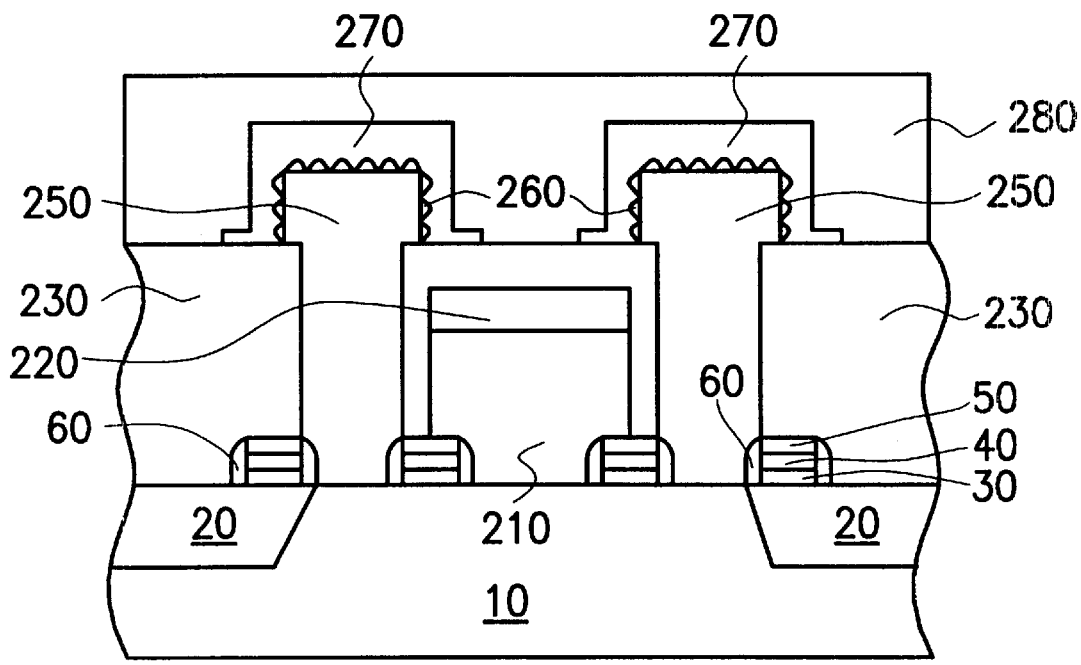
Figure 2:
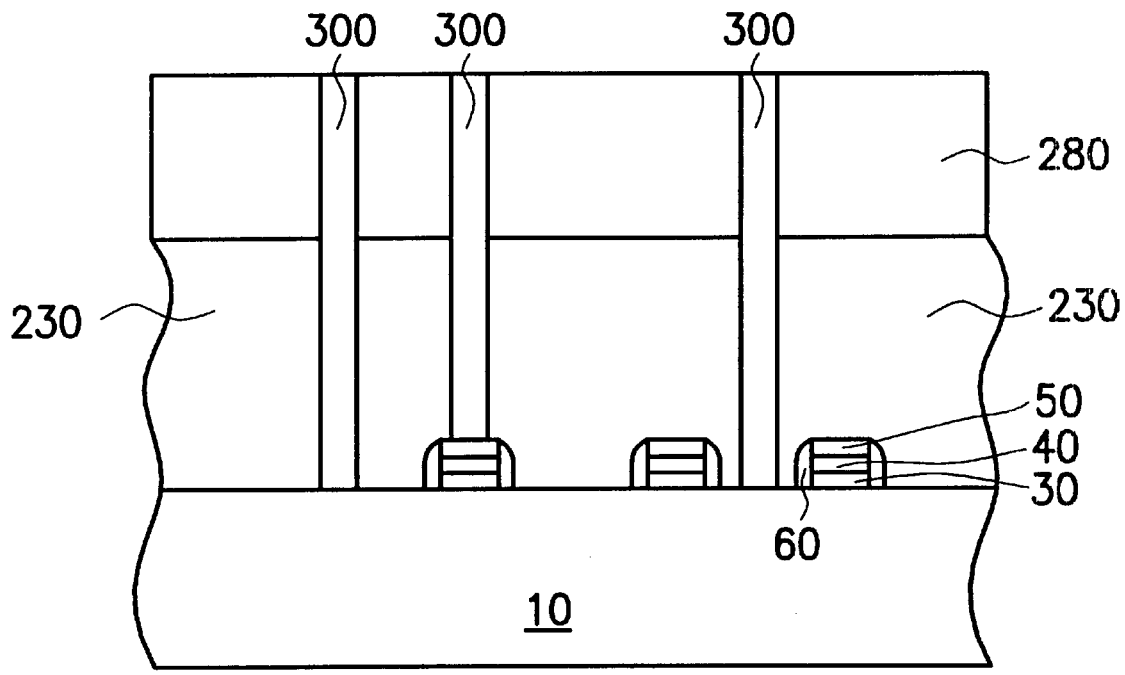
FIG. 2 is a diagrammatic cross-sectional view of a peripheral circuit of a DRAM showing a conventional method for fabricating interconnects.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
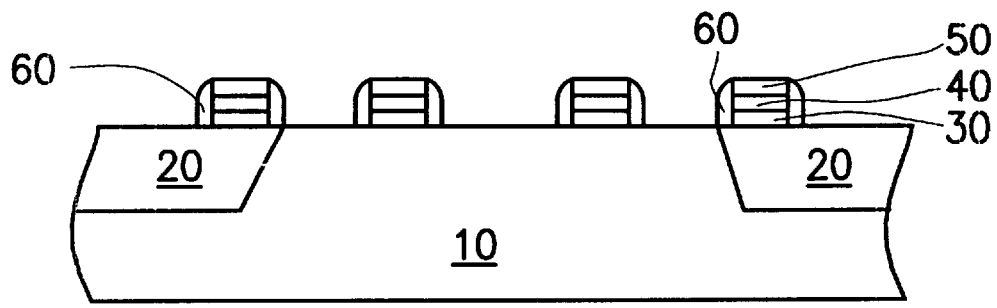
FIGS. 3A and 3E are diagrammatic cross-sectional views showing successive stages of a method for fabricating interconnects of a DRAM cell according to a preferred embodiment of the present invention.
Figure 3B:
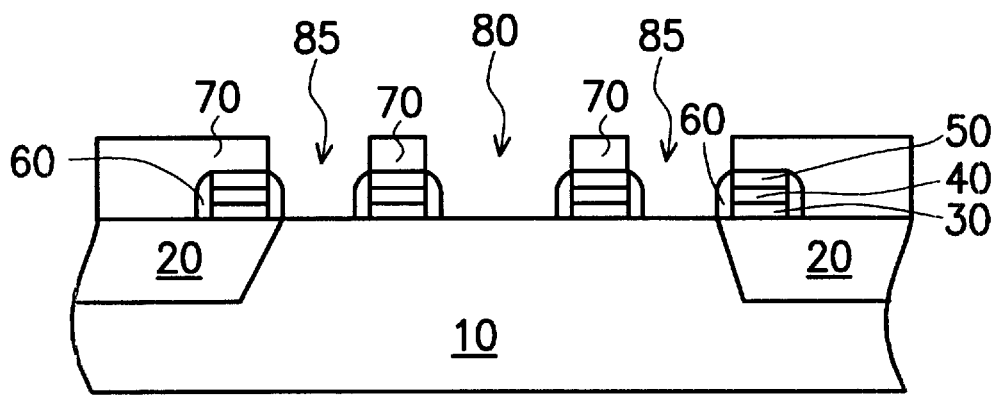
Figure 3C:
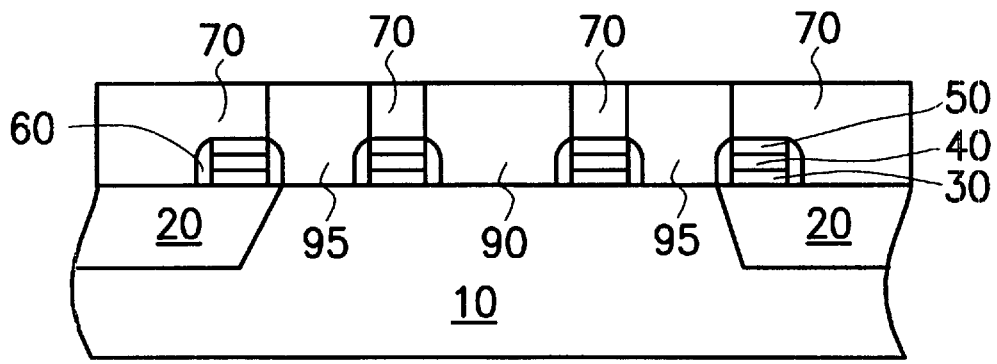
Figure 3D:
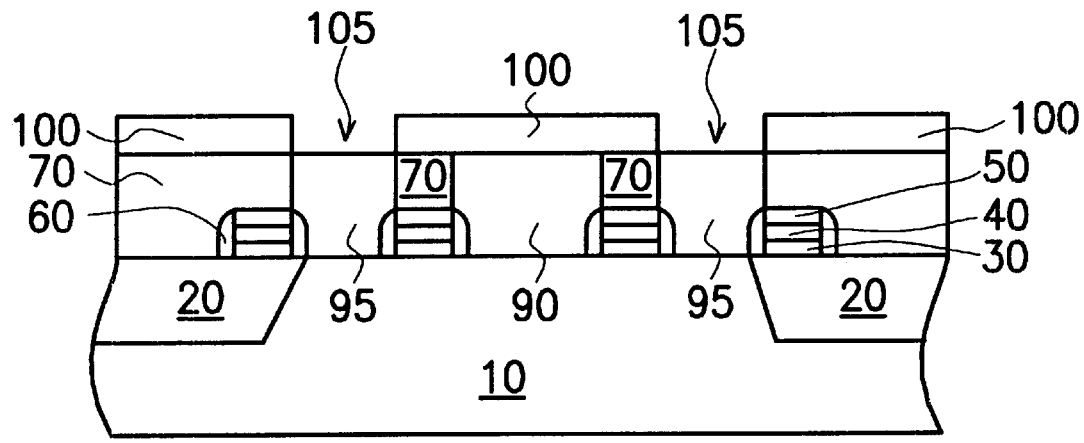
Figure 3E:
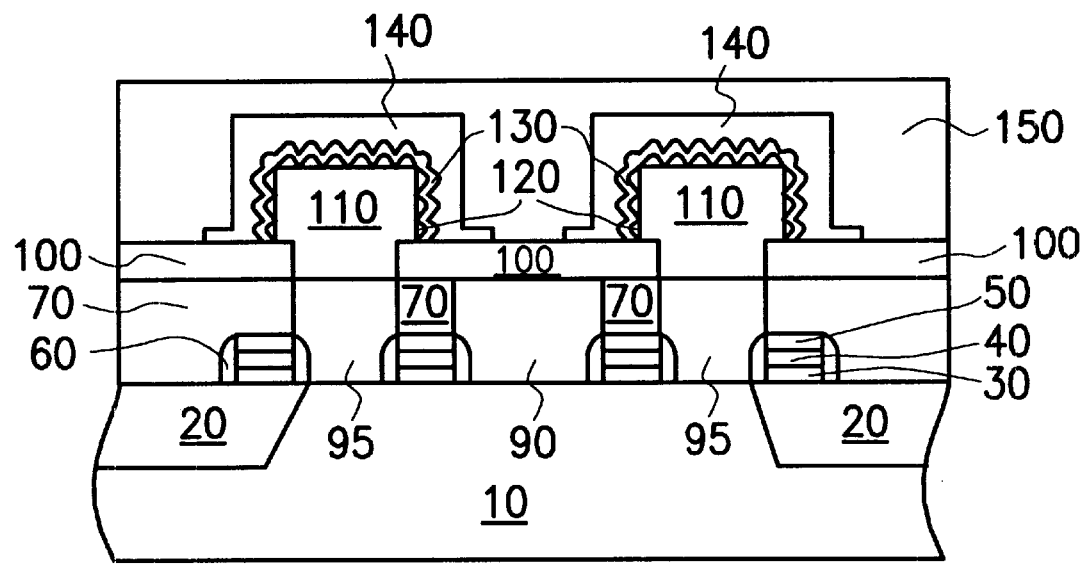

Reference is now made to FIGS. 3A and 3E, where diagrammatic cross-sectional views show successive stages of a method for fabricating interconnects of a DRAM cell according to a preferred embodiment of the present invention.

With reference first to FIG. 3A, a silicon substrate 10 is provided, in which a plurality of insulating structures 20, for example, shallow trenches patterned by a shallow trench isolation method, are formed. Subsequently, deposition is made in the trench by a chemical vapor deposition (CVD) method to form a field oxide layer 20. A chemical mechanical polishing (CMP) method is used to grind the field oxide layer to the surface level of the substrate. A first conductive layer is formed by depositing, for example, a first doped polysilicon layer 30 having a thickness of about 1000 Å and a tungsten silicide layer 40 having a thickness of about 1000 Å, on the substrate 10. A silicon nitride layer 50 having a thickness of about 1500 Å is subsequently deposited on the substrate as a protection layer. Subsequently, a photoresist layer (not shown) is formed on the silicon nitride layer 50. In a photolithography process, transistor gates are covered by a photoresist to expose areas on the substrate 10 which are subsequently etched. A silicon nitride layer is then deposited on the substrate, and an anisotropic etching is performed to form a spacer 60 surrounding the transistor gate.

With reference to FIG. 3B, a first insulating layer 70 is formed by using, for example, a low pressure chemical vapor deposition (LPCVD) to deposit a silicon oxide layer having a thickness of about 2000 Å and a borophosphosilicate glass (BPSG) layer having a thickness of about 7500 Å. The silicon oxide layer and the borophosphosilicate glass (BPSG) layer combine together to form the first insulating layer 70. The CMP method can then be used to smooth the surface of the substrate. Subsequently, contact windows 80 and 85 exposing sources/drain regions on the substrate are patterned by etching the first insulating layer 70. Because of the protection from the silicon nitride layer 50 and the spacer 60, a self-aligned contact (SAC) method can be used to pattern the contact windows 80 and 85.

With reference to FIG. 3C, tungsten is filled into the contact windows, including bit line contact windows 80 and node contact windows 85, forming a plurality of tungsten plugs 90 and 95 as interconnects. Subsequently, the CMP method or a tungsten etch back method can be used to smooth the surface of the tungsten plugs 90 and 95 to the same level as the first insulating layer 70. The use of the tungsten plugs as interconnects instead of conventional doped polysilicon has an advantage of lower resistance, so that the operating speed can be increased.

With reference to FIG. 3D, a second insulating layer 100 is formed in the same way as the first insulating layer 70. Conventional photolithography and etching processes can be used to pattern a second contact window 105. which is positioned on top of the first contact window 95.

With reference to FIG. 3E, a third doped polysilicon layer is deposited to cover the second insulating layer 100 and to fill the second contact windows 105. By using photolithography and etching processes, a lower electrode 110 connecting the tungsten plug 95, and underneath, and a capacitor of a DRAM cell is formed. After that, a hemi-spherical grain (HSG) layer 120 is formed covering the surface of the lower electrode 110. A capacitive dielectric layer 130, for example, a multi-layer structure of oxide/nitride/oxide (ONO), is formed covering the surface of the HSG layer 120. A fourth doped polysilicon layer is deposited and patterned to form an upper electrode 140, covering the capacitive dielectric layer 130. Finally, a protection layer 150 is formed on the substrate 10.

Figure 4:
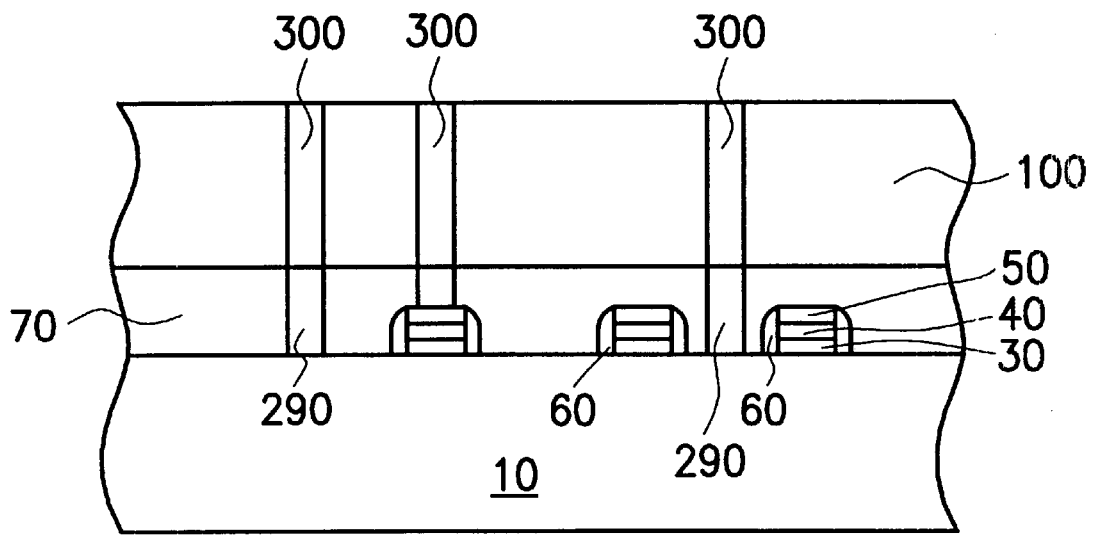
FIG. 4 is a diagrammatic cross-sectional view of a peripheral circuit of a DRAM showing a method for fabricating interconnects according to a preferred embodiment of the present invention.

With reference to FIG. 4, a diagrammatic cross-sectional view of a peripheral circuit of a DRAM shows a method for fabricating interconnects according to a preferred embodiment of the present invention. Note that the fabrication of a DRAM cell and the peripheral circuit of the DRAM are simultaneously performed. The processes involved are therefore quite similar, except for the step for fabricating a capacitor. As shown in FIG. 4, a first doped polysilicon layer 30, a tungsten silicide layer 40, a silicon nitride layer 50, and a spacer 60 surrounding the gate are successively formed. Subsequently, a first insulating layer 70 is formed, which s then patterned to form contact windows by a photolithography and etching processes. The contact windows are subsequently filled with tungsten to form tungsten plugs 290. A second insulating layer 100 is then deposited. Performing the previous photolithography and etching processes to form contact windows on the second insulating layer 100, some of which are positioned on top of the tungsten plugs 290, and filling tungsten into the patterned contact windows, tungsten plugs 300 are formed.

The method of the present invention, which patterns the contact windows segment by segment and fills tungsten into the contact windows segment by segment can prevent the problems of etching a contact window and filling the contact window in the conventional method. Note that the node contact window is filled segment by segment with tungsten instead of the doped polysilicon, simply because the connections between tungsten plugs are much easier to form and lack the structural defects seen in those using doped polysilicon to fill the contact windows. The reasons for this are that the metallic bonds between tungsten atoms are non-oriented and can be arbitrarily bonded, while polysilicon has a covalent bond between silicon atoms, which is an oriented chemical bond. Also, the interface between the micro crystals of polysilicon increases the resistance of the interconnects and dissipates more power.

As a summary, the method for fabricating interconnects of a DRAM according to the preferred embodiment of the present invention has the following advantages:

1. The complexities involved are lessened by connecting short tungsten plugs segment by segment to form a long tungsten interconnect.
2. The resistance of the node contact windows is significantly reduced when the contact windows are filled with tungsten instead of doped polysilicon.

3. The resistance of the bit line and time delay are reduced by using tungsten as the interconnect material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating interconnects of a DRAM for electrically connecting between a lower electrode of the DRAM and one of two source/drain regions of a transistor of the DRAM, comprising the steps of:

providing a substrate, wherein at least the transistor is formed on the substrate, and the transistor comprising one gate and the source/drain regions beside the gate in the substrate;

forming a first insulating layer on the substrate;

forming a plurality of first contact windows in the first insulating layer to expose the source/drain regions on the substrate;

forming a plurality of tungsten plugs to fill each of the first contact windows, wherein the tungsten plugs are level with a surface of the first insulating layer;

forming a second insulating layer on the first insulating layer and the tungsten plugs forming a second contact window to expose one of the tungsten plugs;

forming at least one capacitor on the second contact window connecting one of the tungsten plugs;

filling the second contact window with a polysilicon layer which is further patterned into a lower electrode of the capacitor, so that the capacitor is electrically connected with one of the source/drain regions via the contact plug exposed by the second contact window.

2. The method of claim 1, wherein the gate comprises a silicon nitride layer and a spacer surrounding the gate.

3. The method of claim 1, wherein the step of forming the first insulating layer comprises forming a silicon oxide layer on the substrate and forming a borophosphosilicate glass (BPSG) layer on the silicon oxide layer, wherein the silicon oxide layer has a thickness of about 2000 Å and the BPSG layer has a thickness of about 7500 Å.

4. The method of claim 1, wherein the step of forming the second insulating layer comprises forming a silicon oxide layer on the substrate and forming a borophosphosilicate glass (BPSG) layer on the silicon oxide layer, wherein the silicon oxide layer has a thickness of about 2000 Å and the BPSG layer has a thickness of about 7500 Å.

5. The method of claim 1, wherein the step of forming the first contact windows comprises a self-aligned contact (SAC) method.

6. The method of claim 1, further comprising forming a dielectric layer on the lower electrode and forming an upper electrode on the dielectric layer.

7. The method of claim 6, wherein the lower electrode is doped polysilicon.

8. The method of claim 6, wherein the upper electrode is doped polysilicon.

9. The method of claim 6, wherein the step of forming the dielectric layer comprises a multi-layer structure of oxide/nitride/oxide (ONO), wherein the formation of ONO comprises:

forming a first silicon oxide layer on the surface of the lower electrode by an oxidation method;

depositing a silicon nitride layer on the first silicon oxide layer; and forming a second silicon oxide layer on the surface of the silicon nitride layer by using a thermal oxidation method.

10. A method of fabricating interconnects of a DRAM, comprising the steps of:

providing a substrate, wherein at least one transistor is formed on the substrate, and the transistor comprises one gate and two source/drain regions beside the gate in the substrate;

forming a first insulating layer on the substrate;

forming a plurality of first contact windows in the first insulating layer to expose the source/drain regions on the substrate;

forming a plurality of first tungsten plug to fill each of the first contact windows;

forming a second insulating layer on the first insulating layer and the first tungsten plugs;

forming a plurality of second windows in the second insulating layer to expose a portion of the first tungsten plugs; and forming a plurality of second tungsten plugs to couple with the first tungsten plugs by filling the second contact windows with tungsten.

11. The method of claim 10, wherein the gate comprises a silicon nitride layer and a spacer surrounding the gate.

12. The method of claim 10, wherein the step of forming the first insulating layer comprises forming a silicon oxide layer on the substrate and forming a borophosphosilicate glass (BPSG) layer on the silicon oxide layer, wherein the silicon oxide layer has a thickness of about 2000 Å and the BPSG layer has a thickness of about 7500 Å.

13. The method of claim 10, wherein the step of forming the second insulating layer comprises forming a silicon oxide layer on the substrate and forming a borophosphosilicate glass (BPSG) layer on the silicon oxide layer, wherein the silicon oxide layer has a thickness of about 2000 Å and the BPSG layer has a thickness of about 7500 Å.

14. The method of claim 10, wherein the step of forming the first contact windows comprises a self-aligned contact (SAC) method.

15. A method of forming a tungsten interconnect, comprising:

providing a substrate comprising a conductive region therein;

forming a first insulating layer with a first opening exposing the conductive region on the substrate;

forming a first segment of the tungsten interconnect in the first opening, the first segment of the tungsten interconnect being level with the first insulating layer;

forming a second insulating layer with a second opening aligned with the first opening to expose the first segment of the tungsten interconnect; and filling the second opening with a second segment of the tungsten interconnect, so that the tungsten interconnect comprising a first portion and a second portion is formed, wherein each of the first segment and second segment has a lower aspect ratio compared to the tungsten interconnect.

* * * * *